US006635931B1

(12) United States Patent
Wang (10) Patent No.: US 6,635,931 B1
(45) Date of Patent: Oct. 21, 2003

(54) BONDING PAD-ORIENTED ALL-MODE ESD PROTECTION STRUCTURE

(75) Inventor: Albert Zihui Wang, Wilmette, IL (US)

(73) Assignee: Illinois Institute of Technology, Chicago, IL (US)

( * ) Notice: Subject to any disclaimer, the term of this patent is extended or adjusted under 35 U.S.C. 154(b) by 0 days.

(21) Appl. No.: 10/114,150

(22) Filed: Apr. 2, 2002

(51) Int. Cl.⁷ .............................................. H01L 27/01

(52) U.S. Cl. ........................ 257/355; 257/356; 257/360; 257/361; 257/362; 438/200

(58) Field of Search ................................ 257/173, 174, 257/177, 355–358, 360–362; 438/200, 238, 234

(56) References Cited

U.S. PATENT DOCUMENTS

| | | |
|---|---|---|
| 4,595,941 A | 6/1986 | Avery |
| 4,870,530 A | 9/1989 | Hurst et al. |
| 4,896,243 A | 1/1990 | Chatterjee et al. |
| 5,208,719 A | 5/1993 | Wei |
| 5,272,371 A * | 12/1993 | Bishop et al. ............... 257/362 |
| 5,291,123 A | 3/1994 | Brown |
| 5,359,211 A | 10/1994 | Croft |
| 5,416,351 A | 5/1995 | Ito et al. |
| 5,440,151 A | 8/1995 | Crevel et al. |
| 5,572,394 A | 11/1996 | Ker et al. |
| 5,615,073 A | 3/1997 | Fried et al. |
| 5,616,943 A | 4/1997 | Nguyen et al. |
| 5,637,887 A | 6/1997 | Consiglio |
| 5,646,808 A | 7/1997 | Nakayama |
| 5,682,047 A | 10/1997 | Consiglio et al. |
| 5,706,156 A | 1/1998 | Narita |

(List continued on next page.)

FOREIGN PATENT DOCUMENTS

| | | |
|---|---|---|
| EP | 852 354 | 8/1998 |
| WO | 00/42659 | 7/2000 |
| WO | 00/62419 | 10/2000 |
| WO | 00/74233 | 12/2000 |

OTHER PUBLICATIONS

Albert Z. Wang et al., "A Novel Dual–Direction IC ESD Protection Device", *Proceedings of 7th IPFA '99, Singapore*, 1999 IEEE, pp. 151–155, (0–7803–5187–8/99).

Kaoru Narita et al., "A Novel On–Chip Electrostatic Discharge (ESD) Protection With Common Discharge Line for High–Speed CMOS LSI's", *IEEE Transactions on Electron Devices*, vol. 44, No. 7, Jul. 1997, (0018–9383/97).

Albert Z. Wang et al., "A New Design Methodology Using Simulation for On–Chip ESD Protection Designs for Integrated Circuits", *1998 IEEE*, pp. 509–512. (0–7803–4306–9/98).

H. Feng et al., "A New Pad–Oriented Multiple–Mode ESD Protection Structure and Layout Optimization", *IEEE Electron Device Letters*, vol. 22, No. 10, Oct. 2001. (0741–3106/01).

(List continued on next page.)

*Primary Examiner*—Dung Anh Le
(74) *Attorney, Agent, or Firm*—Pauley Peterson Kinne & Erickson (57) ABSTRACT

An all-mode, bonding pad-oriented ESD (electrostatic discharge) protection structure, protects ICs against ESD pulses of all modes in all directions. A unique quasi-symmetrical layout design is devised to improve ESD structure. Physical symmetry and rounded layout provide uniform current and thermal distribution as well as symmetrical electrical operation characteristics. The ESD structure allows tunable triggering voltage, low holding voltage, low impedance, low leakage, fast response time and low parasitic effect. The ESD structure can easily be placed under or surrounding a bonding pad and consumes little extra silicon. The ESD structure can be implemented in commercial BiCMOS processes and is suitable for multiple-supply, mixed-signal, parasitic-sensitive RF and high-pin-count ICs.

20 Claims, 12 Drawing Sheets

U.S. PATENT DOCUMENTS

| | | |
|---|---|---|
| 5,717,559 A | 2/1998 | Narita |
| 5,739,998 A | 4/1998 | Wada |
| 5,742,085 A | 4/1998 | Yu |
| 5,754,879 A | 5/1998 | Johnston |
| 5,786,616 A | 7/1998 | Fukumoto et al. |
| 5,838,043 A | 11/1998 | Yuan |
| 5,901,022 A | 5/1999 | Ker |
| 5,917,220 A | 6/1999 | Waggoner |
| 6,040,733 A | 3/2000 | Casper et al. |

OTHER PUBLICATIONS

L. Avery, "Using SCR's as Transient Protection Structures in Integrated Circuits", Proc. EOS/ESD Symp., 1983, pp. 177–180.

M–D Ker, C.Y. Wu, T. Cheng and H.H. Chang, "Capacitor––couple Esd Protection Circuit for Deep–submicron LV CMOS ASIC", IEEE Trans. on VLSI Systems, vol. 4, pp. 307–321, 1996.

* cited by examiner

BONDING PAD-ORIENTED ALL-MODE ESD PROTECTION STRUCTURE

BACKGROUND OF THE INVENTION

Field of the Invention

Adequate on-chip ESD (electrostatic discharge) protection design has emerged as a major challenge for mixed-signal (M-S), RF, and high-pin-count ICs as fabrication technologies shrink. This challenge is mainly due to parasitic effects induced by, and the large areas of silicon consumed by, known ESD protection structures (hereinafter commonly referred to simply as "ESD structures"). ESD structures inevitably produce parasitics, e.g., capacitances and noises, resulting in performance degradation of the core IC circuit the ESD structures are designed to protect. Traditionally, a complete ESD protection scheme uses multiple ESD circuits and structures for each I/O pad to survive ESD pulses of all polarities, i.e., I/O to $V_{DD}$ positively (PD) and negatively (ND), I/O to $V_{SS}$ positively (PS) and negatively (NS), as well as $V_{DD}$ to Vss positively (DS) and, in rare cases, $V_{SS}$ to $V_{DD}$ positively (SD). In these circumstances, the influence of known ESD structures on the core IC circuit can become intolerable to parasitic-sensitive M-S/RF ICs. For example, significant degradation in RF ICs in eighteen-hundredths micron technology (0.18 μm) using NMOS ESD structures has been reported (−30% in general and −5% in noise factor) as set forth in Ke Gong, Haigang Feng, Rouying Zhan and Albert Z. Wang, "A Study of Parasitic Effects of ESD Protection on RF ICs", *IEEE Trans. Microwave Theory and Techniques*, Vol. 50, No. 1, Jan. 2002, pp.393–402.

Also, ESD devices consume large areas of silicon on the chip, especially in M-S/RF ICs which demand high ESD protection or high-pin-count chips using a large number of ESD units. For example, up to 30% of the silicon substrate is used for NMOS ESD devices in a transceiver chip as set forth in F. Hatori, S. Kousai and Y. Unekawa, "Shared Data Line Technique For Doubling The Data Transfer Rate Per Pin Of Differential Interfaces", *Proc. IEEE Custom Integrated Circuits Conference*, 2001, pp. 501–504.

Large ESD structures further make chip layout extremely difficult, often leading to pre-mature ESD failure. It is hence imperative to develop compact ESD structures that, while offering high ESD protection, produce little parasitic effect and consume small space on the chip, are layout-friendly, and can be placed underneath or surrounding bonding pads. It is further desirable that such ESD structures provide symmetrical performance characteristics, as well as uniform current and thermal distribution properties, while providing all direction ESD protection with a single structure to make chip layout easier.

An all-direction ESD structure of similar function but different design has been disclosed to the U.S. Patent and Trademark Office by the same inventor in co-pending application Ser. No. 09/450,576, filed Nov. 30, 1999, which is incorporated by reference herein in its entirety.

SUMMARY OF THE INVENTION

The present invention provides an all-mode, pad-oriented, compact, active ESD protection structure. A substantially bilaterally symmetrical layout design, sometimes referred to herein as "quasi-symmetrical", is provided which eliminates possible localized junction damages and improves ESD robustness and provides uniform current and thermal distribution. The ESD structure can provide a low holding voltage (<2V), low discharge impedance (~Ω), fast response time (~0.18 ns) and low parasitics. The structure of the present invention can be placed underneath or surrounding bonding pads and consumes little silicon. Structures according to the present invention can pass 14 KV HBM (human body model) and 15 KV air-gap IEC (International Electrotechnical Commission) ESD zapping tests.

The present invention is particularly suitable for multiple-supply, mixed-signal (M-S), parasitic-sensitive, RF, and high-pin-count ICs.

One embodiment of the invention includes a substantially bilaterally symmetrical layout of N+ and P+ diffusion and P well areas occupying each bonding pad area in an IC. As noted, the substantially bilaterally symmetrical layout taught herein may also sometimes be called a "quasi-symmetrical" layout. In either case the terms are meant to distinguish from a radially symmetrical layout which could include inherent disadvantages as further discussed below. Words of degree, such as "about", "substantially", and the like are used herein in the sense of "at, or nearly at, when given the manufacturing and material limitations inherent in the stated circumstances" and are used to prevent the unscrupulous infringer from unfairly taking advantage of the invention disclosure where exact figures or absolutes are stated as an aid to understanding the invention.

Figure 1:
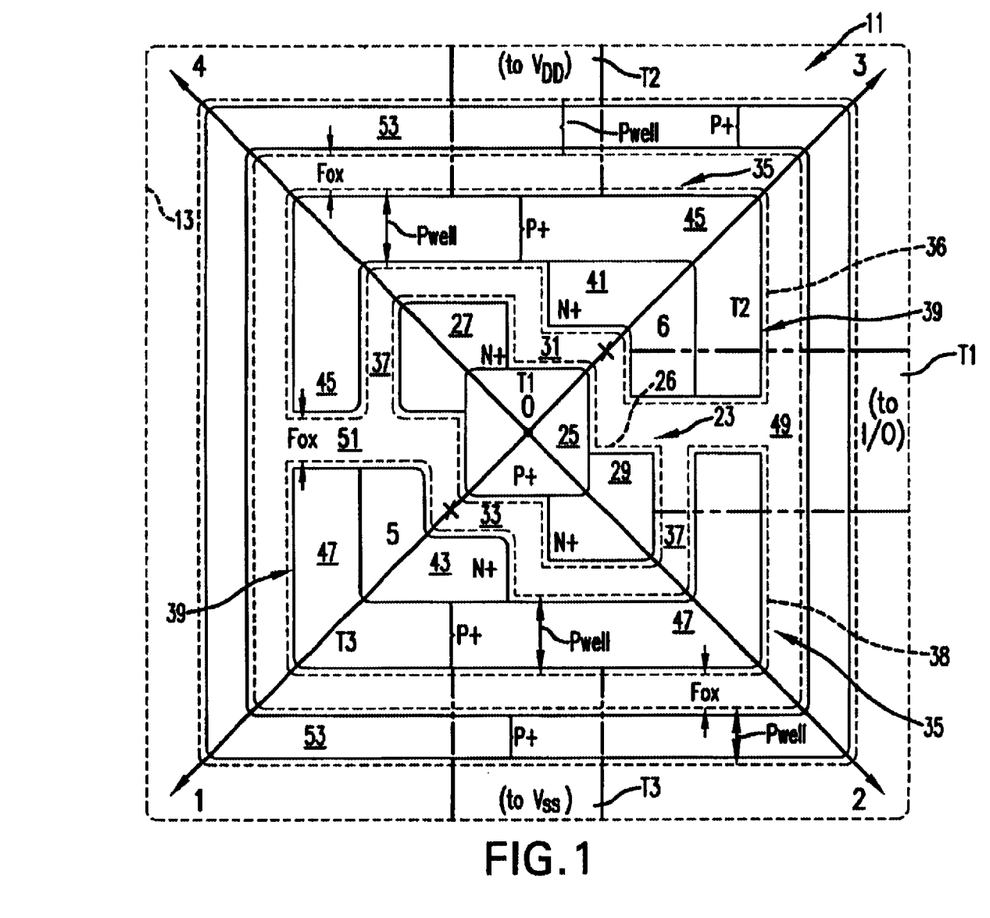
FIGS. 1–2 illustrate a design layout for squared and rounded embodiments of the ESD structure of the present invention, respectively, and having the ESD structure located beneath the bonding pad, with FIG. 1 showing cross sectional lines illustrating SCR formation.

An example of an ESD structure layout according to one aspect of the present invention in an N-epi-layer P well process technology is given, although it will be appreciated by the person having ordinary skill in the art that other variants may be used, e.g., a P epi-layer twin-well (P-well and N-well) process with an intervening N isolation layer. The N-epi-layer P well example, as illustrated in FIG. 1 includes a central construction having a first P center well that has a first center P+ diffusion partially surrounded over first and second areas, such as about −90 degree arcs, or quarter lengths, of its circumference by first and second opposing N+ diffusion areas, respectively. The first and second N+ diffusions are separated by first and second, e.g. about −90 degree, areas of Field Oxide (Fox) insulation. The entire central construction is isolated by a surrounding moat of Field Oxide insulation which includes the first and second areas of Field Oxide insulation.

A second level construction surrounding the central construction outside of the Field Oxide insulation moat includes second and third P-wells, each of which has third and fourth N+ diffusion areas occupying the areas surrounding the opposing about −90 degree areas of Field Oxide insulation of the central construction. Distal from, and adjacent to, each of the third and fourth N+ diffusion areas of the second level are P+ diffusion first and second half rings, also within said second and third P-wells, and separated by areas of Field Oxide insulation connected to the Field Oxide insulation moat. Each half ring surrounds about half of the central construction including one central construction N+ diffusion and one about −90 degree area of Field Oxide insulation. An unbroken protection ring or rings of either or both conductive types (N and P) may surround the second and third P-wells and be separated therefrom by a ring of Field Oxide insulation connected to the Field Oxide insulation areas of the central and second level constructions.

The design, or layout, may be in the form of a circular layout where all wells and rings have a substantially constant radius, i.e. being rounded. Alternatively, the design may be in the form of a more squared layout. In this embodiment, it is preferred that all wells and rings have at least an outside, or distal, edge of a bend between any two straight edges thereof rounded to promote even, or uniform, current and thermal distribution.

The invention may provide at least 6 one-direction SCR (silicon controlled rectifier) devices, or essentially 3 two-direction SCR devices, thereby providing a fast, low impedance, active discharging path in each ESD stressing mode, i.e. ND, PD, PS, NS, DS and SD modes. The device can be made compact and will have low parasitic effects.

DETAILED DESCRIPTION

Figure 2:
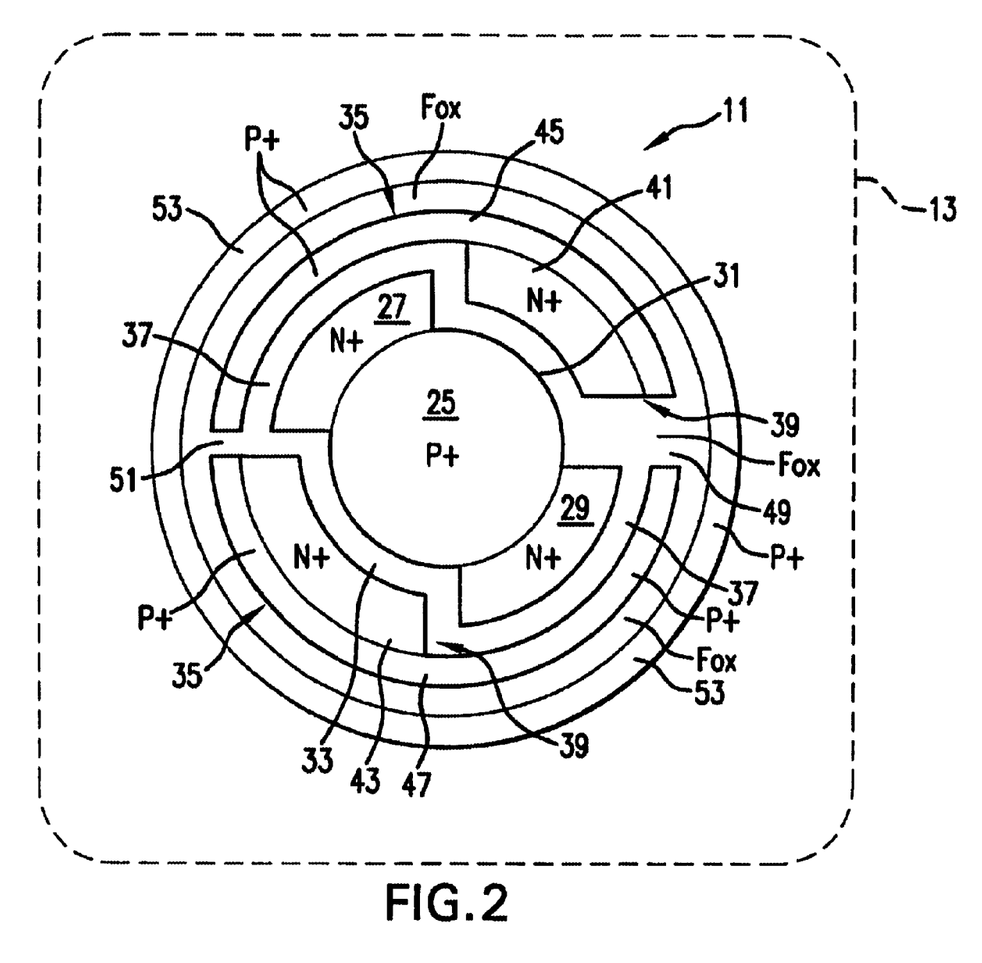
Figure 3:
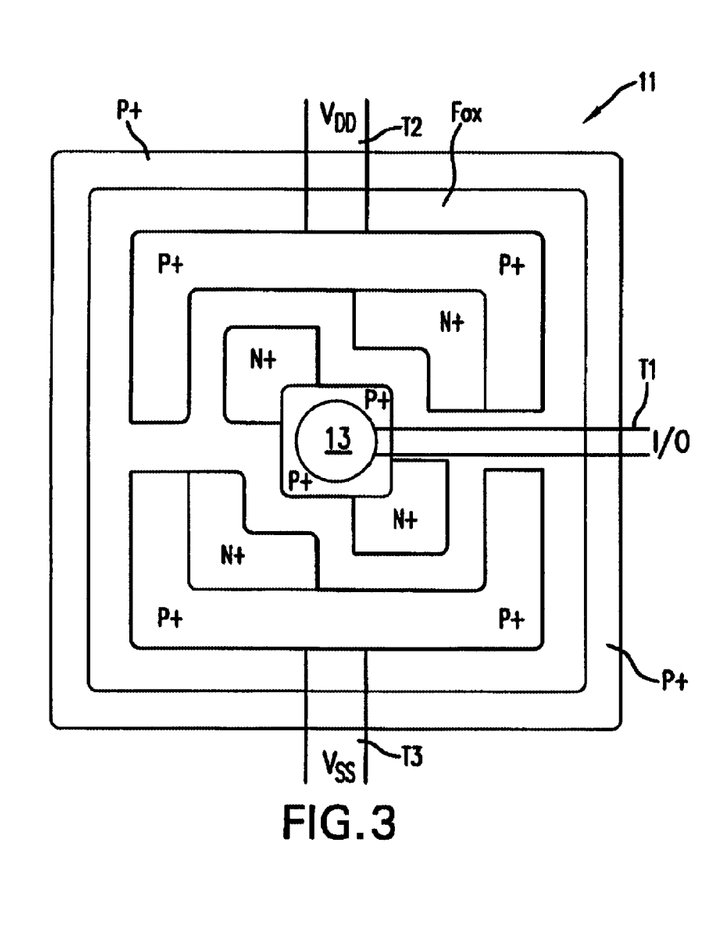
FIGS. 3 and 4 illustrate variants of FIGS. 1 and 2 wherein the ESD structure surrounds the bonding pad and further illustrates the three terminals of the structure, i.e., I/O, $V_{DD}$ and $V_{SS}$.
Figure 4:
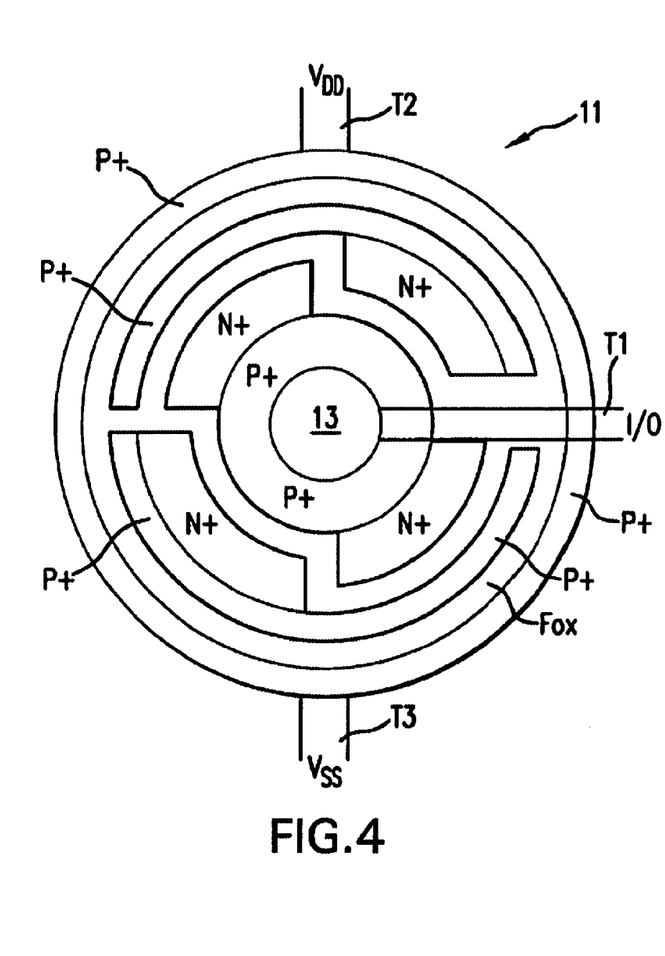

Referencing FIGS. 1 and 2, there is shown a bonding pad-oriented ESD structure 11, placed underneath a bonding pad 13 (in phantom). In FIGS. 3 and 4, the structures of FIGS. 1 and 2 are shown with less numbering and without lining of the P wells or Field Oxide (Fox) for clarity of viewing of the ESD structure 11. T1 contacts the I/O pin of an internal circuit, T2 contacts positive $V_{DD}$ or supply voltage, and terminal T3 contacts negative power supplies, e.g., $V_{SS}$ or ground. It will be noted that FIGS. 3 and 4 show a variant wherein the bonding pad 13 is substantially surrounded by, rather than underneath, the ESD structure 11. The variant used will depend upon the needs of the actual chip.

The ESD protection structure 11 for an internal circuit 12 (FIG. 13) of an Integrated Circuit (IC) provides an single structure having equivalent subcircuits to comprise SCRs that provide active-mode, low-impedance discharging channels in each ESD discharge path, namely ND, PD, PS, NS, DS, and SD. As seen, the structure 11 is laid out in a substantially bilaterally, or so-called "quasi-symmetrical" structure having a central construction 23 with a central P well 26 with a central diffusion 25 of a first (P+) type. The central diffusion 25 is surrounded over first and second quarter lengths of its periphery or circumference, i.e. about –90 degree arcs of its circumference, by first and second inner diffusions in the central P well of a second (N+) type 27, 29, respectively, at opposite sides of the circumference of the central diffusion 25. The first and second inner diffusions 27, 29 are separated by first and second areas of Field Oxide (Fox) insulation 31, 33, each covering the remaining quarter lengths, i.e. about –90 degrees, of central diffusion circumference between the first and second inner diffusions of a second (N+) type 27, 29.

Surrounding the central construction 23 is a distal construction 35 having a moat 37 of Field Oxide insulation. The moat 37 includes the first and second areas of Field Oxide insulation between the first and second inner diffusions 27, 29. Also included in the distal construction 35 is a second level construction 39 outside of the moat 37 which includes second and third P wells 36, 38 containing third and fourth diffusions 41, 43 of the second (N+) type. The third and fourth diffusions 41, 43 of the second (N+) type occupy the areas surrounding the first and second areas of Field Oxide insulation 31, 33 of the central construction. Second and third P+ diffusions are placed as first and second half rings 45, 47 of the first (P+) type and located distally from each of the third and fourth diffusions 41, 43 of the second (N+) type. The first and second half rings 45, 47 are separated from each other by areas of Field Oxide insulation 49, 51 connected to the moat 37. Each of the second and third P wells 36, 38 surrounds about half of the central construction 23 and the moat 37, with each said half of the central construction 23 including one of the first and second diffusions 27, 29 of the second type (N+) of the central construction 23 and one of the first and second areas of Field Oxide insulation 31, 33. Each half ring 45, 47 is further adjacent one of the third and fourth diffusions 41, 43 of the second type (N+). One or more unbroken guard ring diffusions 53 of either or both types (P+, N+) in like conductive type wells (P, N) may be placed around the half rings 45, 47, and separated therefrom by Field Oxide to reduce current leakage, etc.

Figure 13:
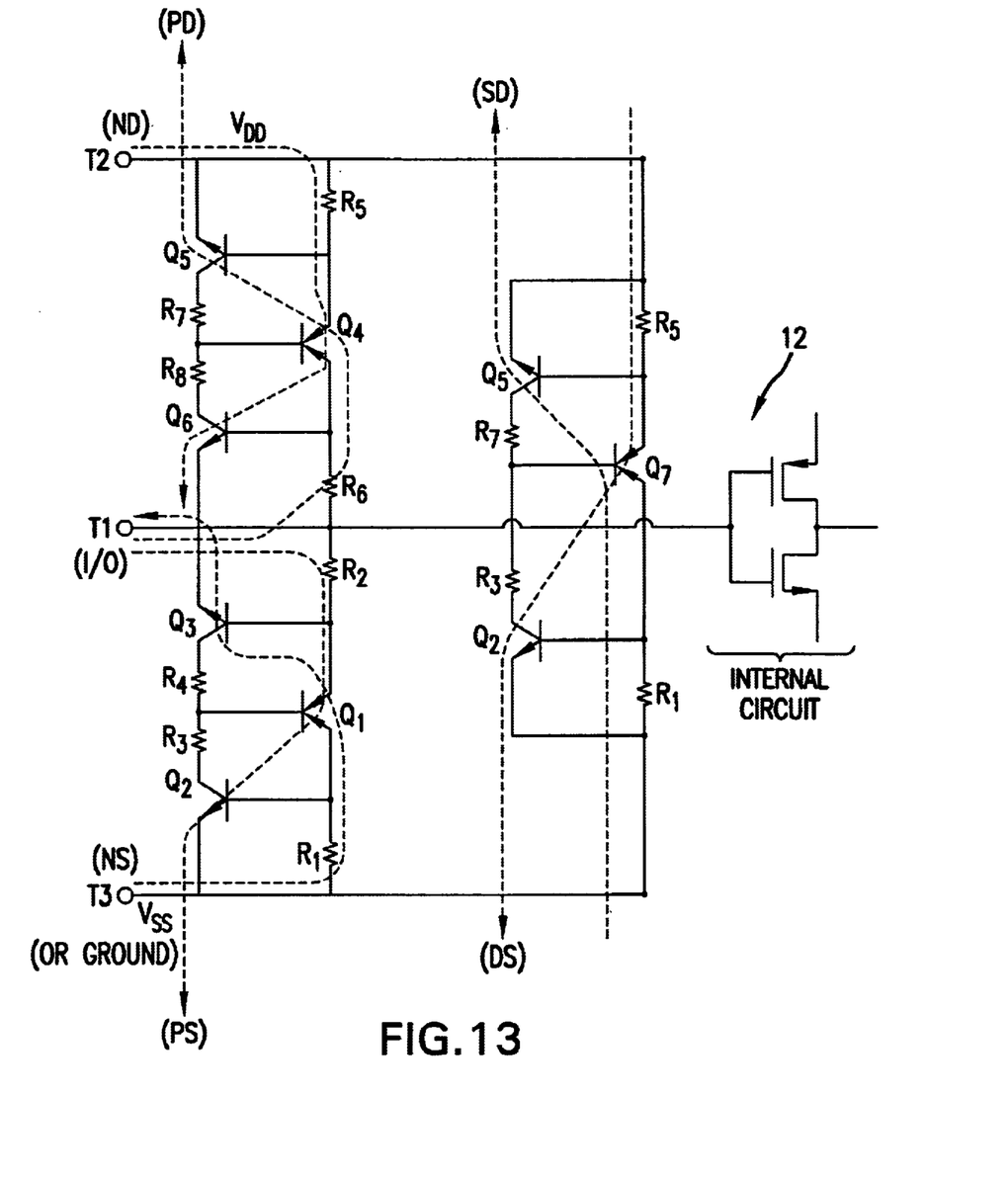
FIG. 13 illustrates an equivalent circuitry for an embodiment of the present invention with discharge paths shown thereon.

FIG. 13 illustrates the equivalent circuitry of an ESD structure formed by the seven diffusions (four N+, three P+) in three P wells as seen in FIGS. 1 and 2.

Conceptually, the ESD structure 11 consists of seven parasitic bipolar transistors, Q1–Q7, and eight parasitic resistors, R1–R8, that define six SCR (silicon controlled rectifier) type components as illustrated in FIGS. 8–13.

Figure 8:
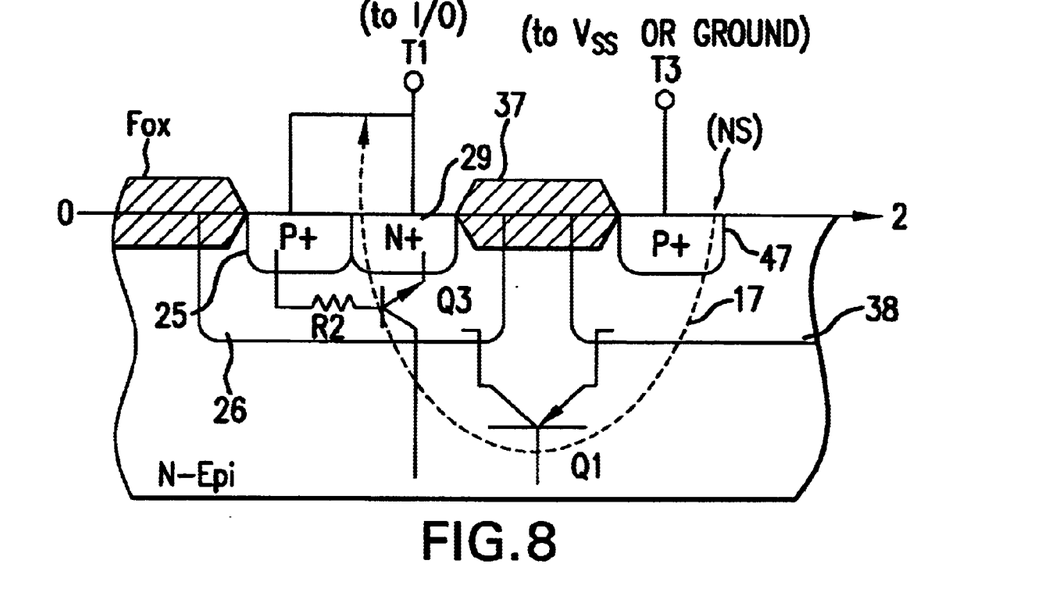
FIGS. 8–12 illustrate cross sections along the cross sectional lines of FIG. 1, with FIG. 12 being a simultaneous view along lines 1–5 and 3–6.
Figure 9:
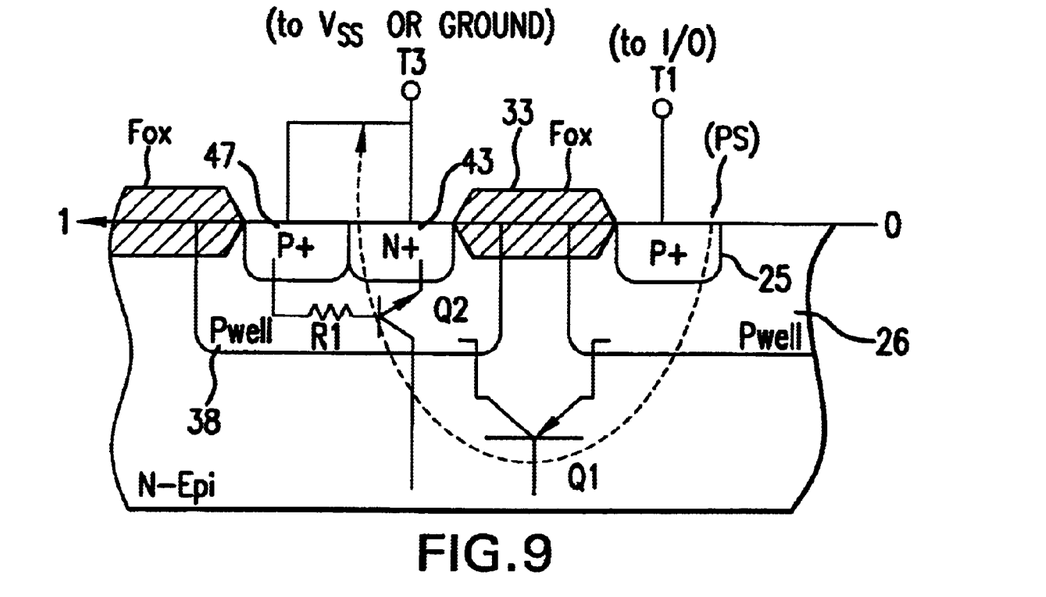
Figure 10:
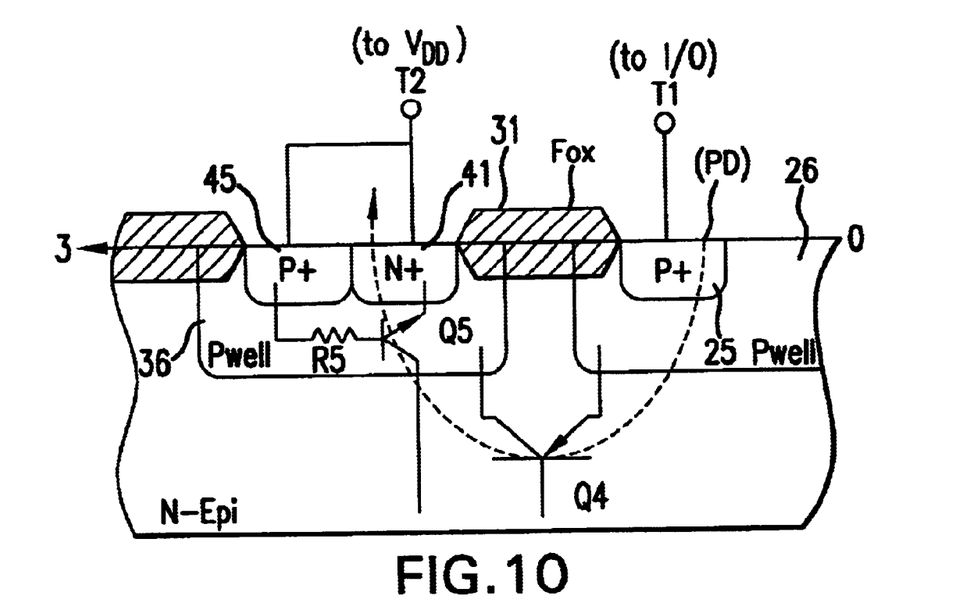
Figure 11:
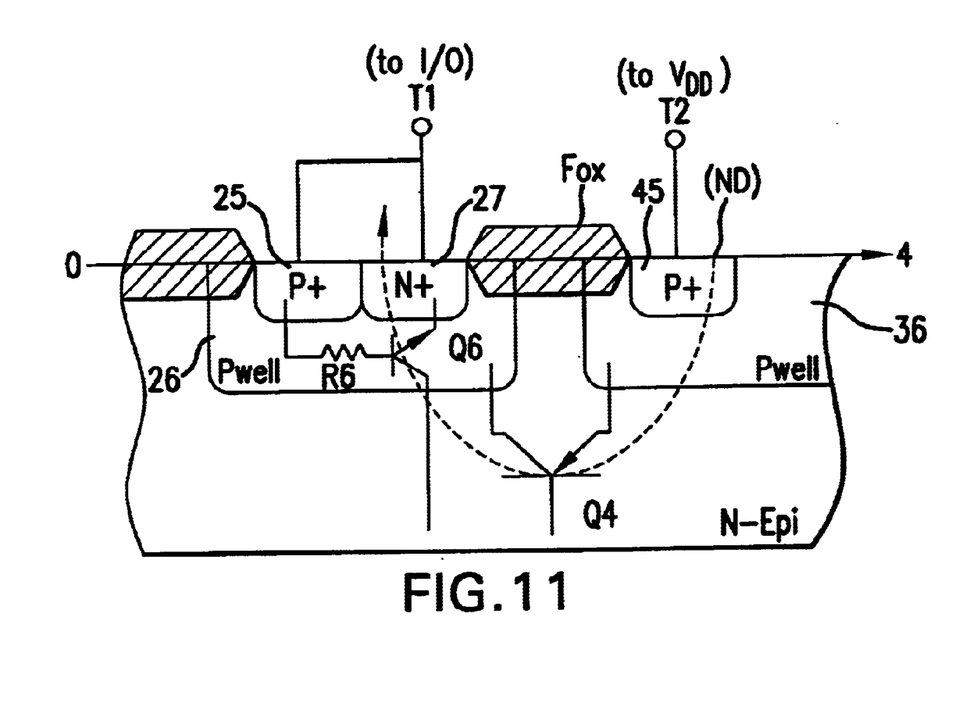

An example of the ESD protection operation is as follows. The ESD structure 11 is normally off, thus not interfering with IC function. In FIG. 8, a cross section along the 0–2 line, e.g., in an NS stressing case where a negative ESD transient appears between the I/O terminal T1 and the $V_{SS}$ terminal T3, the Base/Collector junction of Q1 is reverse biased until avalanche breakdown occurs. The excess holes flow into the I/O pad via the central P+ diffusion 25 in the central P well 26 and cause a voltage drop across the parasitic resistor R2. Since the P+ and N+ diffusions 25, 29 are shorted together by T1, a positive voltage builds up across the Base/Emitter junction of Q3. This voltage then turns on the vertical NPN transistor Q3, thus triggering the SCR Unit of Q1–Q3 at a trigger voltage of $V_{t1}$ and driving the SCR into deep snapback. Therefore, an active low-impedance discharge channel, represented by arrow 17, is formed to shunt the ESD current transients safely. Meanwhile, the I/O pad terminal T1 is clamped to a very low holding voltage ($V_h$~2V) level to avoid dielectric rapture in the gate oxide. The IC chip is therefore protected against the NS mode ESD pulse.

When the ESD event is over, the SCR discharges quickly and turns off as current decreases to below the holding current ($I_h$). To avoid latch-up, a holding current much greater than the supply current ($I_h >> _{DD}$) is a key design factor, though accuracy in $I_h$ testing is still uncertain.

Figure 5:
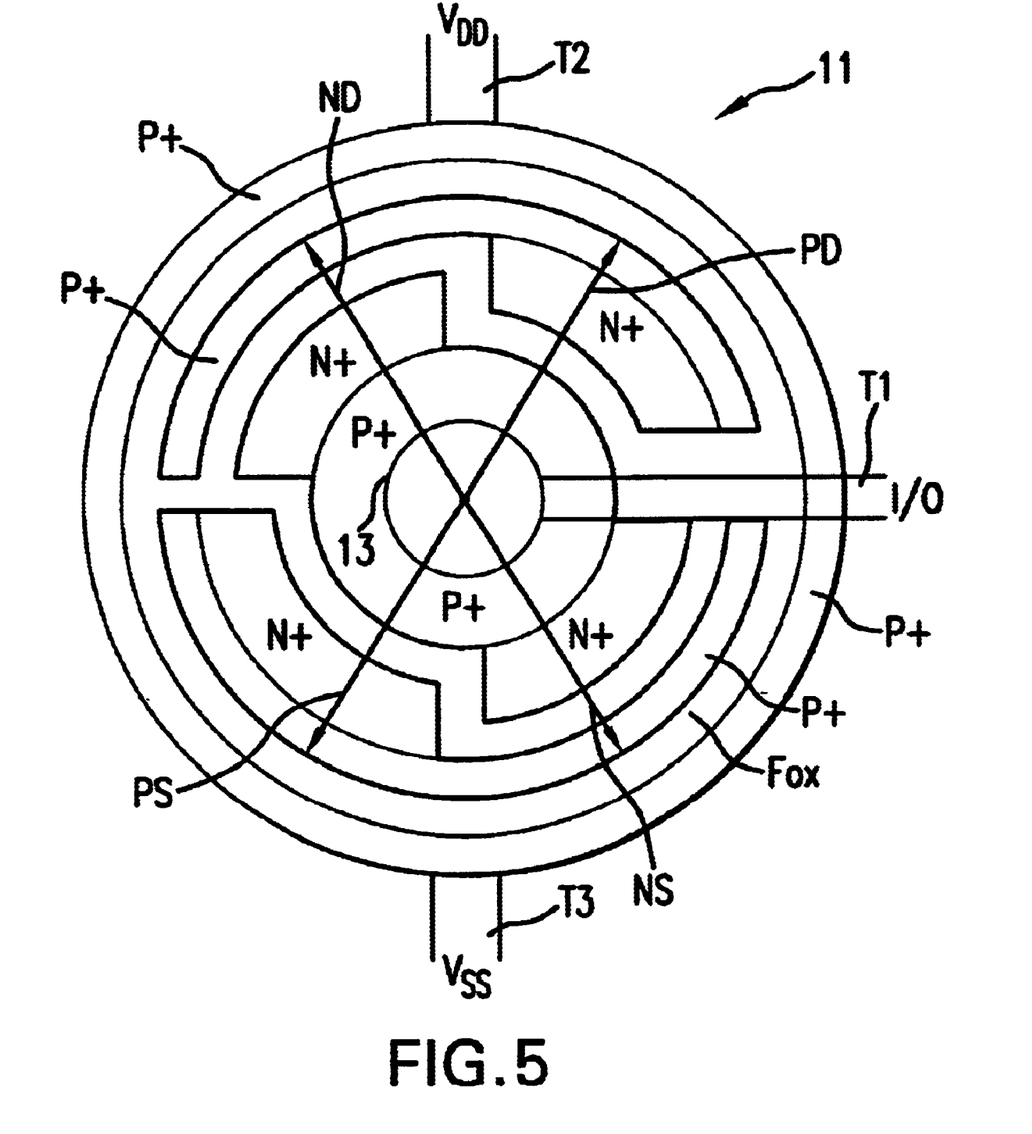
FIG. 5 illustrates the SCR formation and ESD discharge paths for one embodiment of the present invention.
Figure 12:
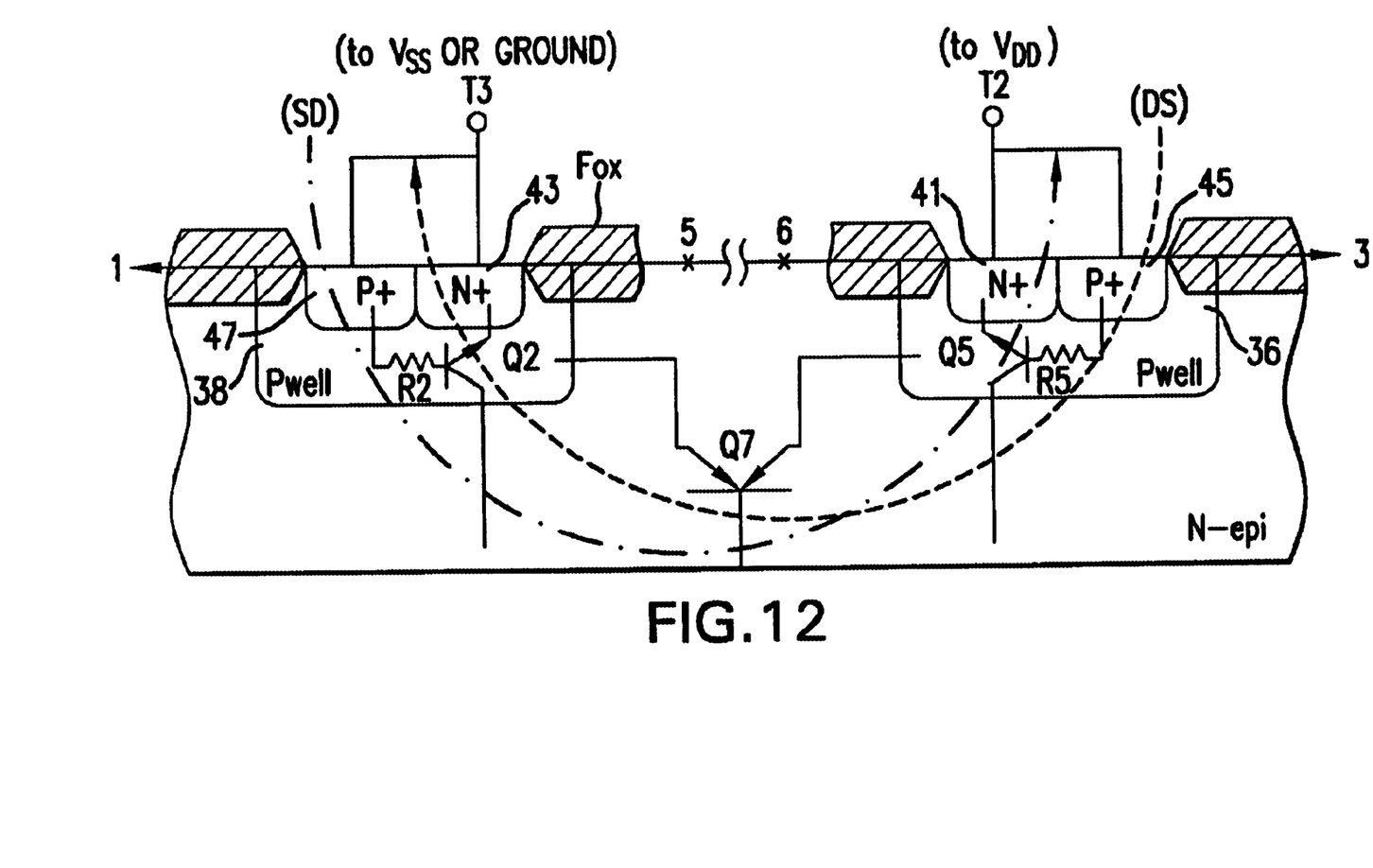

Similarly, the ESD structure forms SCR-based active discharging paths for all other ESD pulses. Referencing FIG. 9, a cross section along the 0–1 line, in PS mode the SCR Unit of Q1–Q2 conducts currents between T1 and T3. Referencing FIG. 10, a cross section along the 0–3 line, in PD mode, the SCR Unit of Q4–Q5 takes ESD transients between T1 and T2. Referencing FIG. 11, a cross section along the 0–4 line, in ND mode, the SCR Unit of Q4–Q6 takes ESD transients between T2 and T1. Referencing FIG. 12, a simultaneous cross section along the 1–5 and 3–6 lines, in DS mode, Q7–Q2 forms a discharging channel between T2 and T3. In SD mode, Q7–Q5 forms a discharging channel between T3 and T2. Therefore, it can be seen that only one single such ESD structure per I/O pad is needed for all-modes of ESD protection. Referencing FIG. 5, the SCR structure and path for each of the discharge modes PD, ND, PS, and NS is labeled on a rounded embodiment of the ESD structure. The discharge paths for the DS and SD modes are shown in FIG. 12

Figure 6:
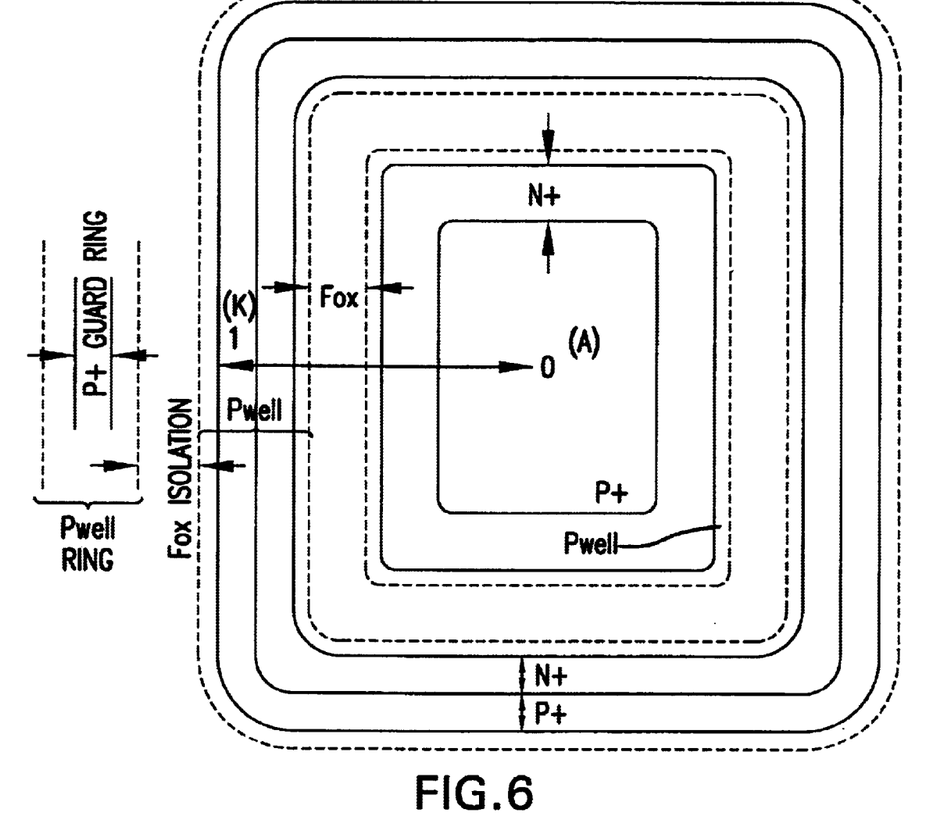
FIGS. 6 and 7 illustrate a radially symmetrical layout of an ESD structure.
Figure 7:
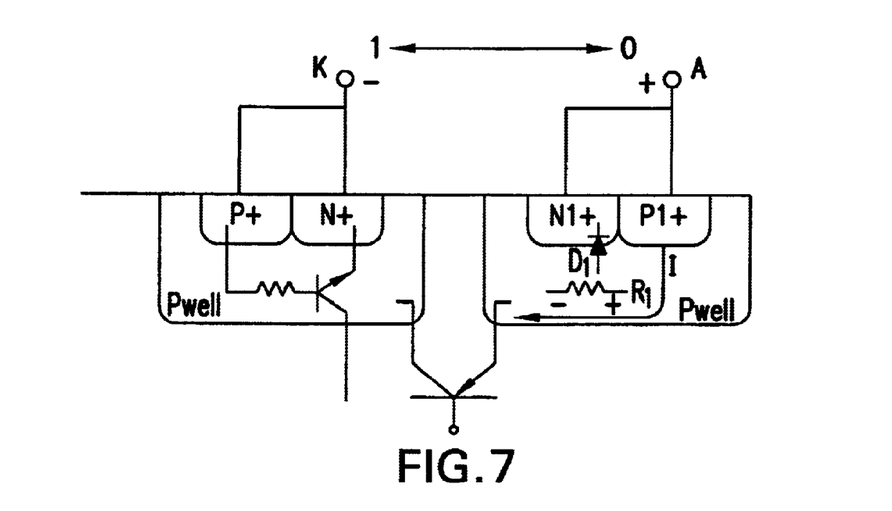

Referencing FIGS. 6 and 7, if a radially symmetrical layout (p+/n+ at cathode and n+/p+ at anode) is used as shown, when a positive ESD pulse comes to the anode (A) against the cathode (K), a large current transient (I) will flow into P1+ at A. The current transient flows underneath the N1+ area at A toward the cathode region. Since the lateral P-well parasitic resistance R1 exists, a voltage drop of IR1 will build up. Because the P1+ and N1+ diffusion areas are shorted at A, the IR1 voltage drop will reverse bias the N1+/P1+ junction. Under large ESD pulses, there is a chance the N1+/P1+ (diode) junction may enter reverse break down before the SCR of the ESD structure turns on. This can cause early ESD damage.

Referencing FIG. 8, in a preferred embodiment of the present invention, to eliminate such localized defects at the anode T1, while assuring the desired lateral voltage build-up at cathode T3, the N+ diffusion region at T3 is only partial, and absent in the cross section of line 0–2, when compared to FIG. 6, so that the P+0 region 47 will face the N+P+ regions at T1 to ensure a desired P+N+P+ pattern from anode to cathode (here in NS mode) thus resulting in the so called "quasi-symmetrical" structure.

Thus, advantages of the present invention include: one compact ESD structure per pad is enough for complete ESD protection as opposed to conventional multiple-unit solutions, resulting in much lower ESD parasitics; the bonding pad-oriented ESD structure, whether substantially squared, substantially rounded, surrounding, or underneath a bonding pad, reduces the burden of chip layout and hence, layout-induced accidental ESD failures; and the area-efficiency of the ESD structure significantly reduces silicon used for ESD protection, a desired benefit to high-pin-count chips. Under-pad layout designs with various sizes (100 $\mu$m×100 $\mu$m, 80 $\mu$m×80 $\mu$m, etc.) can be implemented, e.g., in commercial 1.2 $\mu$m and 0.6 $\mu$m BiCMOS technologies.

Figure 14:
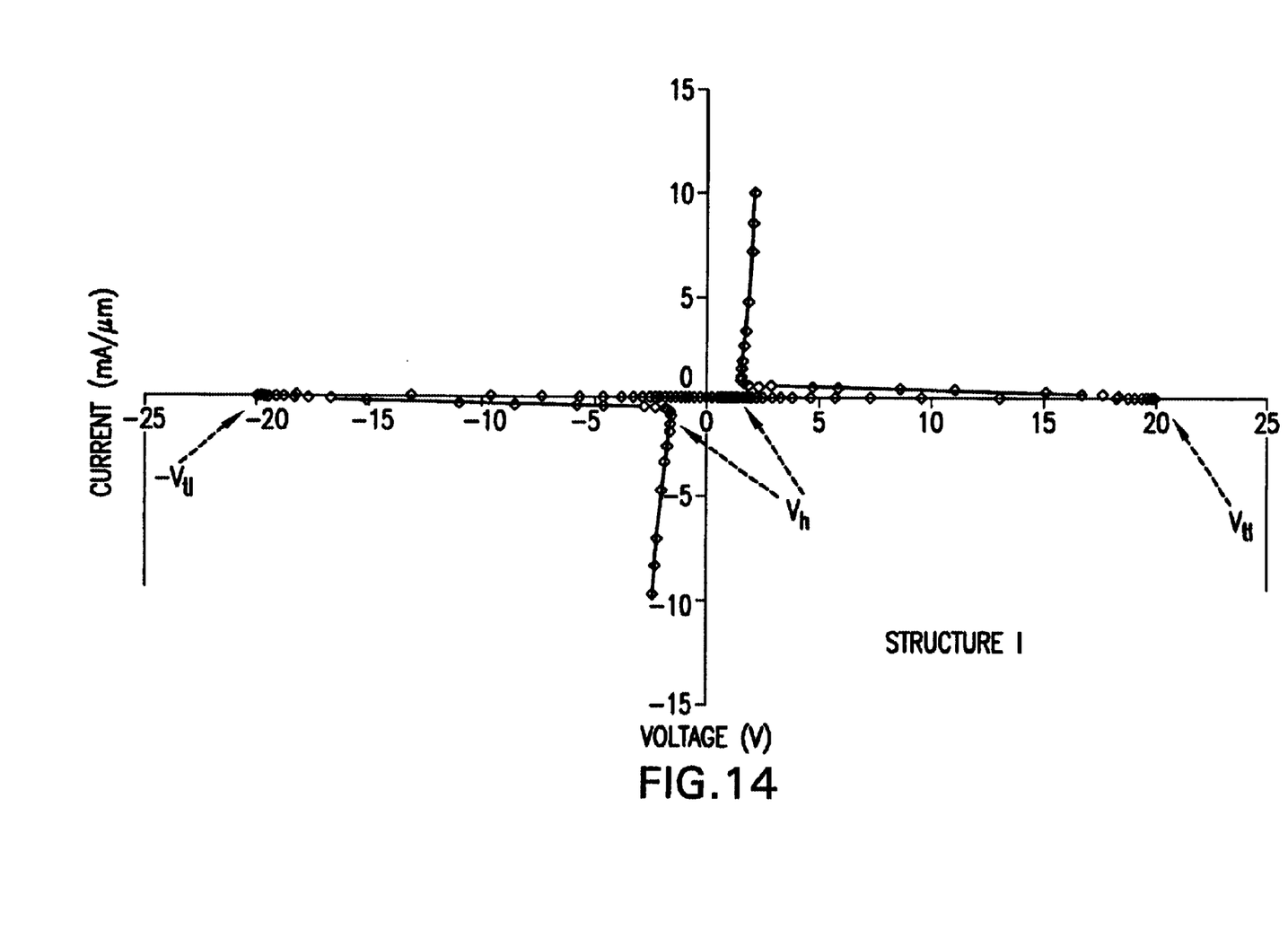
FIGS. 14–16 are graphs of Typical I–V characteristics by ESD simulation for the ESD protection structures of three different implementations of the present invention, Structures 1, 2, and 3, respectively, having different turn-on voltages.
Figure 15:
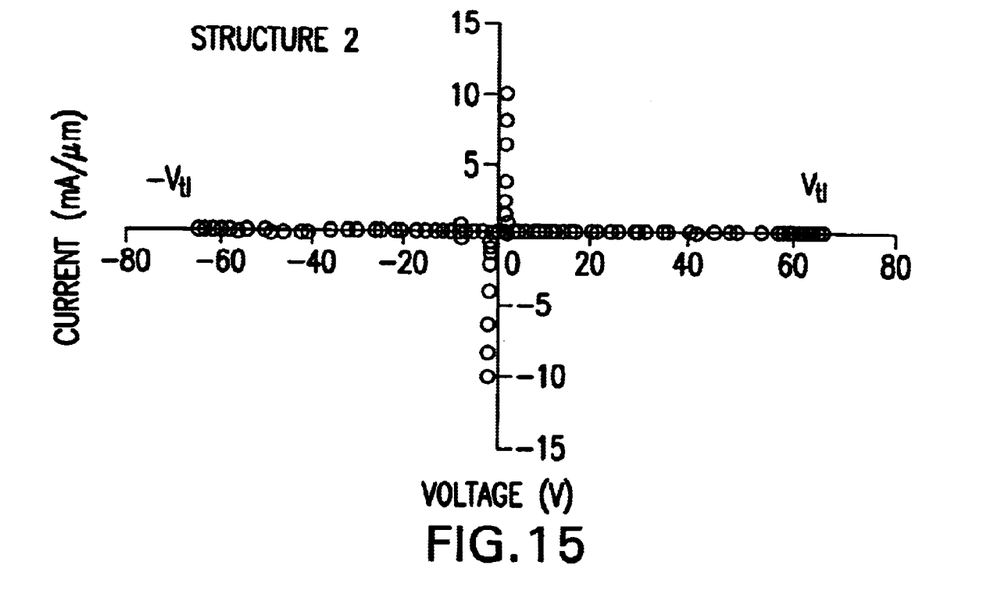
Figure 16:
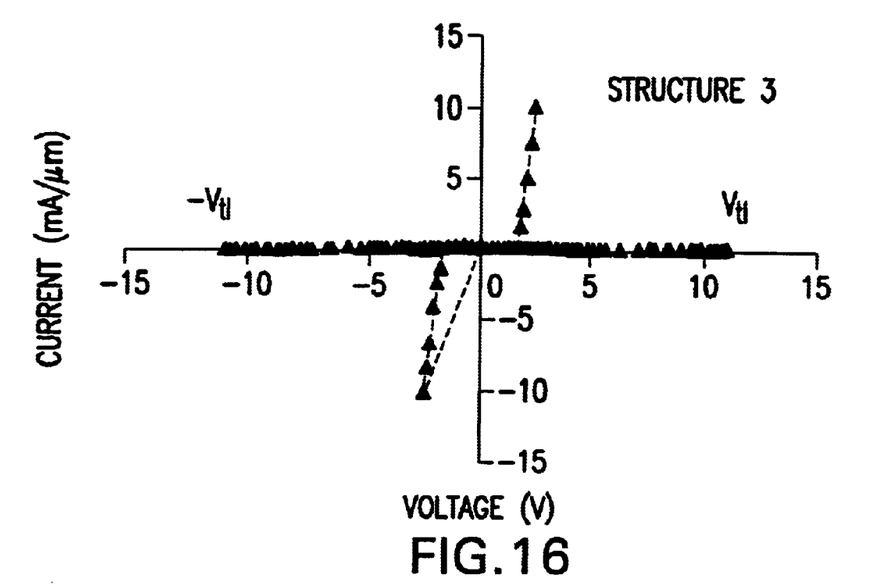

Several design tests were conducted to prove the concept and implemented in commercial BiCMOS technologies. Mixed-mode ESD simulation, involving multiple-level coupling (process-device-circuit-electro-thermal) was performed. FIGS. 14–16 show typical I–V curves for three implementation examples, i.e., Structures 1, 2, and 3 (Table 1), under dual-direction ESD stresses between two terminals. Symmetrical and deep snapback I–V curves are observed as expected, with various trigger voltages ($V_{t1} \approx 11V$, 20V, and 65V) realized for different applications.

TABLE 1

| ESD | Breakdown | $V_{t1}$ (V) Simulation | $V_{t1}$ (V) Test | $V_h$ (V) Simulation | $V_h$ (V) Test |
|---|---|---|---|---|---|
| 1 | Avalanche | 19.95 | ~19 | 1.57 | ~1.3 |
| 2 | Avalanche | 65.44 | ~69 | 1.8 | ~2 |
| 3 | Punch-through | 10.98 | ~12 | 1.85 | ~1.1 |

The structures 1, 2, and 3 use differently doped PN junctions to obtain different avalanche breakdown voltages and use various p-well-to-p-well spacing for lower punch-through breakdown to realize $V_{t1}$ control. The person having ordinary skill in the art will appreciate that beyond these design variables, for further reduction in $V_{t1}$, external trigger-assisting circuits may be used. Short response times of 0.1~0.3 ns (nanosecond) indicates that the structure of the present invention works with fast, sub-1 ns, ESD transients of the IEC (International Electrotechnical Commission) ESD model (see *The International Electrotechnical Commission*, IEC 1000-4-2, 1995.). The measurements for FIGS. 17–18 were done using a curve tracer, transmission line pulse (TLP) tester (see T. Maloney and N. Khurana, "Transmission Line Pulsing Technique For Circuit Modeling Of ESD Phenomena", *Proc. 7$_{th}$ EOS/ESD Symposium.*, pp. 49–54, 1985.), and ESD zapping testers.

Figure 17:
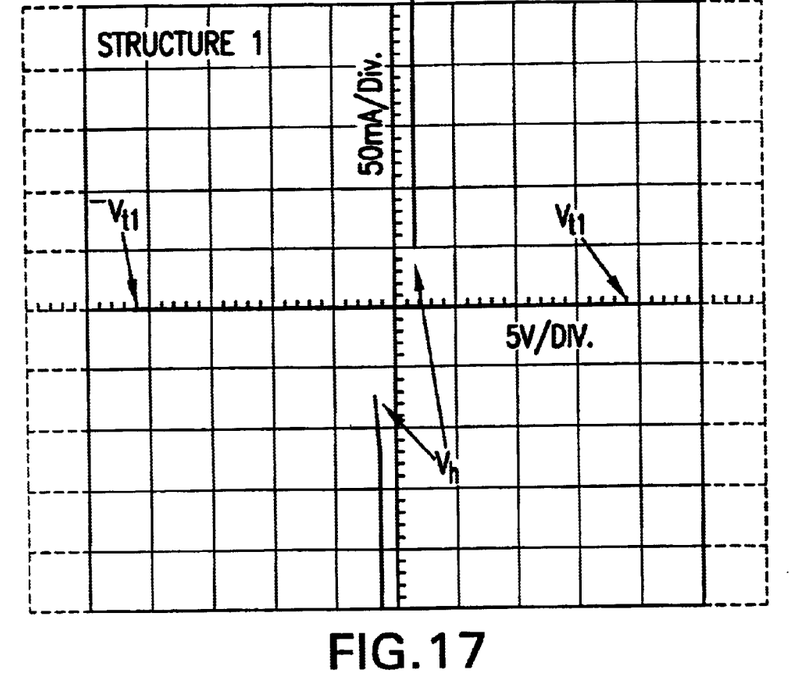
FIGS. 17–18 are graphs of measured I–V characteristics for the ESD protection Structure 1 from curve tracer testing and from TLP testing, including leakage current measured at 5V in TLP tests, respectively.
Figure 18:
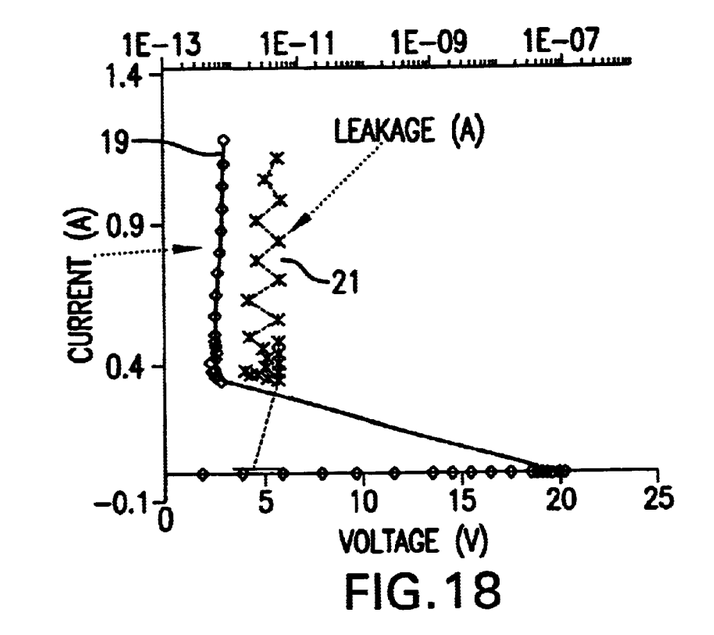

FIG. 17 shows an I–V curve for Structure 1 using a curve tracer, with $V_{t1} \approx 19V$ and $V_h \approx 1.3V$ as suggested by simulation. FIG. 18 shows a transient I–V curve 19 from a TLP test. A TLP test was included because it provides instantaneous I–V curves, which is critical to accurate ESD protection design. The TLP pulse rise time and duration used were 10 ns and 100 ns, respectively, as similar to HBM (human body model) specifications (see *MIL-STD*-883C, 3015.7, notice 8, "Military Standard for Test Methods and Procedures for Microelectronics: ESD Sensitivity Classification", 1989.). Leakage current 21 was measured after each TLP pulse under normal $V_{DD}=5V$ biases. Low leakage current (~pA) was observed as shown by the top scale in FIG. 18.

Table 1 summarizes typical data, showing good fitting between ESD simulation and tests. Final ESD robustness was evaluated by performing ESD zapping tests using both standard HBM and extremely fast IEC testing models. Over 14 KV HBM and 15 KV air-gap IEC ESD protection were achieved. Since one device per pad is needed for full ESD protection, area efficiency of ~2.8V/um$^2$ is estimated. However, accuracy of this estimate is not assured due to the upper limitations of the ESD zapping testers used.

The present invention has thus described an all-mode, bonding pad-oriented, compact, active, single ESD protection structure. The quasi-symmetrical, or bilaterally symmetrical, structure design eliminates possible localized junction damages and improves ESD robustness. As noted above, the ESD structure of the present invention lends itself to adjustable triggering (e.g., 10~65V) voltages, low holding voltages (e.g., <2V), low discharge impedance (e.g., ~$\Omega$), low leakage current (e.g., ~pA), fast response time (e.g., ~0.18 ns) and low parasitics. The structure can be placed underneath or surrounding bonding pads and consumes little extra silicon.

The structure is suitable for ESD protection of M-S, RF and high-pin-count ICs.

Many variants of the present invention may occur to the person having ordinary skill in the art upon gaining an understanding of the examples presented herein. The examples are meant to be illustrative and not exclusive and therefore, the scope and spirit of the invention are intended to be limited only by the appended claims.

I claim:

1. An ESD protection structure for an internal circuit of an Integrated Circuit (IC) comprising:
   a circuit having subcircuits providing an active devices in each ESD discharge mode, namely ND, PD, PS, NS, DS, and SD; and the circuit comprised of a structure having:
   a) a central construction having:
      i) a first diffusion of a first type and
      ii) the first diffusion surrounded over first and second lengths of its circumference by first and second inner diffusions of a second type, the first and second inner diffusions being separated by first and second areas of insulating material;
   b) a distal construction surrounding the central construction and having:
      i) a moat of insulating material surrounding the central construction, the moat including the first and second areas of insulating material between the first and second inner diffusions,
      ii) a second level construction outside of the moat including third and fourth diffusions of the second type, the third and fourth diffusions of the second type occupying the areas surrounding the first and second areas of insulating material of the central construction;
         and first and second half rings being diffusions of the first type, the first and second half rings being distal from and adjacent each of the third and fourth diffusions of the second type, and the first and second half rings being separated from each other by areas of insulating material connected to the moat, each of the first and second half rings surrounding about half of the central construction and about half of the moat, said half of the central construction including one of the first and second diffusions of the second type of the central construction and one of the first and second areas of insulating material.

2. The ESD protection structure of claim 1 wherein the active devices are SCRs.

3. The ESD protection structure of claim 1 wherein the first and second inner diffusions cover about one-quarter of the circumference of the central diffusion.

4. The ESD protection structure of claim 1 wherein the insulating material is Field Oxide.

5. An ESD protection structure for an internal circuit of an Integrated Circuit (IC) comprising:
   a circuit having subcircuits providing an active device controlling each ESD discharge path, namely ND, PD, PS, NS, DS, and SD; and said circuit comprising:
   a) a central construction having:
      i) a central well of a first conductive type having therein a central diffusion of a first type, and
      ii) the central diffusion surrounded over first and second about-quarter lengths of its circumference by first and second inner diffusions of a second type, respectively, at opposite sides of the central diffusion circumference; the first and second inner diffusions being separated by first and second about-quarter length areas of Field Oxide insulation;
   b) a distal construction surrounding the central construction and having:
      i) a moat of Field Oxide insulation surrounding the central construction, the moat including the first and second about-quarter length areas of Field Oxide insulation between the first and second inner diffusions,
      ii) a second level construction outside of the moat including second and third wells of the first conductive type having third and fourth diffusions of the second type, the third and fourth diffusions of the second type occupying the areas surrounding the first and second about-quarter length areas of Field Oxide insulation of the central construction, and
         first and second half rings being diffusions of the first type, the first and second half rings being distal from and adjacent to each of the third and fourth diffusions of the second type, and the first and second half rings being separated from each other by areas of Field Oxide insulation connected to the moat, each of the first and second half rings surrounding about half of the central construction and the moat, said half of the central construction including one of the first and second diffusions of the second type of the central construction and one of the first and second about-quarter length areas of Field Oxide insulation.

6. The ESD protection structure of claim 5 further including an unbroken guard ring of the first conductive type surrounding the half rings and separated therefrom by a ring of Field Oxide.

7. The ESD protection structure of claim 5 being under a bonding pad of the IC.

8. The ESD protection structure of claim 5 at least partially surrounding a bonding pad of the IC.

9. The ESD protection structure of claim 5 wherein the first and second inner diffusions of a second type are substantially L-shaped with the bend of said L-shape being rounded on at least a distal edge thereof.

10. The ESD protection structure of claim 5 wherein the third and fourth diffusions of a second type are substantially L-shaped with the bend of said L-shape being rounded on at least a distal edge thereof.

11. The ESD protection structure of claim 5 wherein the first and second half rings of a first type are substantially U-shaped with the bend of said U-shape being rounded on at least a distal edge thereof.

12. The ESD protection structure of claim 5 wherein the I/O terminal electrically contacts the central construction.

13. The ESD protection structure of claim 5 wherein the $V_{DD}$ terminal electrically contacts a first half of the second level construction.

14. The ESD protection structure of claim 5 wherein the $V_{SS}$ or Ground terminal electrically contacts a second half of the second level construction.

15. The ESD protection structure of claim 5 wherein the diffusions and half rings have substantially constant radii.

16. The ESD protection structure of claim 5 wherein the first diffusion type is P+.

17. The ESD protection structure of claim 16 wherein the first conductive type is P.

18. The ESD protection structure of claim 5 wherein the first diffusion type is N+.

19. An ESD protection structure for an internal circuit of an Integrated Circuit (IC) comprising:

a circuit providing an SCR in each ESD discharge path, and the circuit comprised of a substantially bilaterally symmetrical structure having:
  a) a central construction having:
    i) a central well of a first conductive type having therein a central diffusion of a first type, and
    ii) the central diffusion surrounded over first and second about-quarter lengths of its circumference by first and second inner diffusions of a second type, respectively, at opposite sides of the central diffusion circumference, the first and second inner diffusions being separated by first and second about-quarter length areas of Field Oxide insulation;
  b) a distal construction surrounding the central construction and having:
    i) an unbroken moat of Field Oxide insulation surrounding the central construction,
    ii) a second level construction outside of the moat including second and third wells of the first conductive type having third and fourth diffusions of the second type, the third and fourth diffusions of the second type occupying the areas surrounding the first and second about-quarter length areas of Field Oxide insulation of the central construction, and
    first and second half rings being diffusions of the first type, the first and second half rings being distal from, and adjacent to, each of the third and fourth diffusions of the second type, and the first and second half rings being separated from each other by areas of Field Oxide insulation connected to the moat, each of the first and second half rings surrounding about half of the central construction and the moat, said half of the central construction including one of the first and second diffusions of the second type of the central construction and one of the first and second about-quarter lengths areas of Field Oxide insulation.

20. The ESD protection structure for an internal circuit of an Integrated Circuit (IC) of claim 19 further comprising:
  said circuit comprised of a substantially bilaterally and not radially symmetrical structure.

* * * * *